(12) United States Patent
Dong (10) Patent No.: US 7,019,586 B2
(45) Date of Patent: Mar. 28, 2006

(54) HIGH-SPEED GM-C TUNING

(75) Inventor: Zhiwei Dong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/806,630

(22) Filed: Mar. 23, 2004

(65) Prior Publication Data

US 2005/0212590 A1   Sep. 29, 2005

(51) Int. Cl.
*H03K 5/00* (2006.01)
(52) U.S. Cl. .......................... 327/553; 327/552
(58) Field of Classification Search ........ 327/552–560; 330/305
See application file for complete search history.

(56) References Cited

U.S. PATENT DOCUMENTS

| | | | | |
|---|---|---|---|---|
| 5,245,646 A * | 9/1993 | Jackson et al. | ................. | 377/2 |
| 5,625,317 A * | 4/1997 | Deveirman | ................. | 327/553 |
| 5,635,884 A | 6/1997 | Fujii | ........................ | 333/215 |
| 5,715,529 A * | 2/1998 | Kianush et al. | ............. | 455/266 |
| 5,793,251 A | 8/1998 | Fujii | ........................ | 329/337 |
| 5,825,265 A | 10/1998 | Fujii | ........................ | 333/215 |
| 5,912,583 A * | 6/1999 | Pierson et al. | ............. | 327/553 |
| 5,914,633 A * | 6/1999 | Comino et al. | ............. | 327/553 |
| 5,945,889 A * | 8/1999 | Shanthi-Pavan et al. | ... | 333/17.1 |
| 6,317,016 B1 | 11/2001 | Kuo | ........................ | 333/215 |
| 6,574,288 B1 | 6/2003 | Welland et al. | ............. | 375/327 |
| 6,677,814 B1 * | 1/2004 | Low et al. | .................. | 327/554 |
| 6,842,710 B1 * | 1/2005 | Gehring et al. | ............. | 702/107 |

* cited by examiner

*Primary Examiner*—Dinh T. Le
(74) *Attorney, Agent, or Firm*—Trop, Pruner & Hu, P.C.

(57) ABSTRACT

A technique to achieve high-speed tuning of a Gm-C circuit, such as, for example, a Gm-C filter. In one embodiment, a master Gm-C time-constant circuit incorporates at least one element (either a transconductance or a capacitance) that is matched to a corresponding element (transconductance or capacitance) in the (slave) Gm-C circuit. A waveform generated by the master Gm-C time-constant circuit is used to control a sampler. In one embodiment, the sampler samples a precision counter so as to result in a sampler output having a polarity that steers the tuning voltage in the necessary direction. A tuning control stage coupled to the sampler output implements an algorithm that causes the tuning voltage to converge, with a predetermined precision, to the desired tuning voltage.

37 Claims, 4 Drawing Sheets

| STEP | B4 | B3 | B2 | B1 | Qs |
|---|---|---|---|---|---|
| STEP 1 | 1 | 0 | 0 | 0 | 1 |
| STEP 2 | 1 | 1 | 0 | 0 | 0 |
| STEP 3 | 1 | 0 | 1 | 0 | 0 |
| STEP 4 | 1 | 0 | 1 | 1 | 1 |
| STEP 5 | 1 | 0 | 1 | 0 | 0 |

HIGH-SPEED GM-C TUNING

FIELD OF THE INVENTION

The invention relates generally to the design and operation of Gm-C (transconductance-capacitance) circuits and, more particularly, to techniques for frequency tuning such Gm-C circuits.

BACKGROUND

Gm-C circuits, and, particularly, Gm-C filters, have found widespread application in the design of electronic circuitry. Gm-C filters are especially conspicuous in communications equipment, for example, where they may be utilized in the realization of bandpass filters, VCOs (voltage controlled oscillators), loop filters for PLLs (phase-locked loops), and the like. Principal advantages of Gm-C filters derive from their easy compatibility with prevailing integrated circuit fabrication technology, and from the ability of Gm-C filters to be electronically (and therefore, rapidly) tuned. That is, the center frequency or cutoff frequency of a Gm-C filter may be adjusted electronically by the application of an appropriate control signal (e.g., tuning voltage or signal). The control signal is conventionally applied to either a controllable transconductance or controllable capacitance in the Gm-C filter. As is well known, the transconductance of a Gm-C filter may be controlled by controlling a bias current that flows in an active device, such as a bipolar or MOS (metal oxide semiconductor) transistor. The capacitance of Gm-C filter may be controlled by applying an appropriate tuning voltage to a voltage-dependent capacitance (such as a varactor diode), or by selectively switching fixed, binary-weighted capacitors.

A number of approaches have been deployed to tune Gm-C filters. In accordance with one such approach, the time constant of a "master" Gm-C circuit is quantified by reference to a precision clock signal. During the period of time required for the master Gm-C circuit to charge to a predetermined voltage, the precision clock will output a number of pulses. A control signal is applied to a variable capacitance, or to a variable transconductance, in the master Gm-C circuit so as to cause the number of clock pulses generated during the charging interval to converge to a predetermined number. The control signal is also applied to a variable capacitance, or variable transconductance, in the ("slave") Gm-C filter circuit.

In general, the tuning precision that may be achieved using the time-constant, pulse-counting tuning method, as alluded to above, is a function, i.e., is inversely proportional to, the number of clock pulses expected to be generated during the charging period. With respect to the above-described approach, it may be demonstrated that the dual objectives of high-speed filter tuning and easily realizable semiconductor device fabrication are mutually antagonistic. For example, if it is assumed that a tuning precision of 5% is required in the target Gm-C filter, and that device geometries are such that readily implemented components in the Gm-C time-constant circuit may present typical transconductance and capacitance values of, respectively, 5 milliohms$^{-1}$ and 10 pf (picofarads), then a 10 GHz clock is required. A clock signal at this frequency is likely difficult to realize in a standard CMOS (complementary metal/oxide/silicon) process. Alternatively, in order to reduce the clock frequency to 200 MHz, for example, a 500 pf capacitor is required in the Gm-C time-constant circuit. A capacitor of this size occupies a significant amount of semiconductor real estate. Furthermore, processing limitations impose substantial constraints on the degree to which the transconductance, Gm, of the Gm-C time-constant circuit may be reduced (corresponding to an increase in resistance, R). That is, reduction of Gm is contraindicated in designs in which the transconductance element in the Gm-C circuit must be matched to the transconductance in the Gm-C filter.

Accordingly, what is required is an approach to tuning a Gm-C filter, wherein there is achieved satisfactory arbitration of the mutually conflicting constraints that are imposed in order to conform to readily available semiconductor device processing technology.

SUMMARY OF THE INVENTION

The subject Gm-C tuning technique enables high-speed acquisition of a tuning signal to be applied to a Gm-C circuit, such as a Gm-C filter for a PLL, baseband channel, and the like. The tuning technique is predicated on components and clock frequencies, for example, that are readily accessible with resort to conventional integrated circuit fabrication technology.

In one aspect, the invention inheres in an apparatus to tune a Gm-C circuit. The apparatus comprises a master Gm-C circuit that, in turn, comprises a tunable element. The tunable element in the master Gm-C circuit may be, for example, a transconductance or a capacitance. The master Gm-C circuit is configured to provide a waveform that is dependent on a tuning signal that is applied to the tunable element. A precision signal generator provides precision signal to a sampler. The sampler has a first input coupled to a waveform from the master Gm-C circuit, a second input coupled to the precision signal, and an output to provide a tuning error signal. A tuning control stage has an input coupled to the output of the sampler and has an output to provide the tuning signal to the master Gm-C circuit and to the tunable Gm-C circuit.

In another aspect of the invention, an apparatus to tune a Gm-C circuit comprises a master Gm-C time-constant circuit that generates a time-varying waveform dependent on a master controllable element. The master controllable element is matched to a slave controllable element in the Gm-C circuit. A comparator having an input coupled to the time varying waveform drives a sampling circuit that, in one embodiment, includes a counter to sample a precision clock signal. The frequency of the precision clock is correlated to the time-varying waveform so that the counter output constitutes an effective tuning error signal. The tuning error signal is input to a tuning control stage that operates algorithmically to construct a tuning signal that converges, with a designed degree of precision, to the ideal value of the tuning signal.

Although the invention is not necessarily so limited, in one embodiment, the tuning control stage develops a sequence of digital tuning signals in accordance with a defined algorithm. The algorithm satisfies requirements for rapid convergence, with a designed precision, to an ideal value for the tuning signal.

BRIEF DESCRIPTION OF THE DRAWINGS

The subject high-speed tuning method for Gm-C circuits may be better understood by, and its many features, advantages and capabilities made apparent to, those skilled in the art with reference to the Drawings that are briefly described immediately below and attached hereto, in the several Figures of which identical reference numerals (if any) refer to identical or similar elements, and wherein.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION

For understanding of the subject Gm-C tuning technique, reference may be had to the following Detailed Description, including the appended Claims, in connection with the above-described Drawings.

Figure 1:
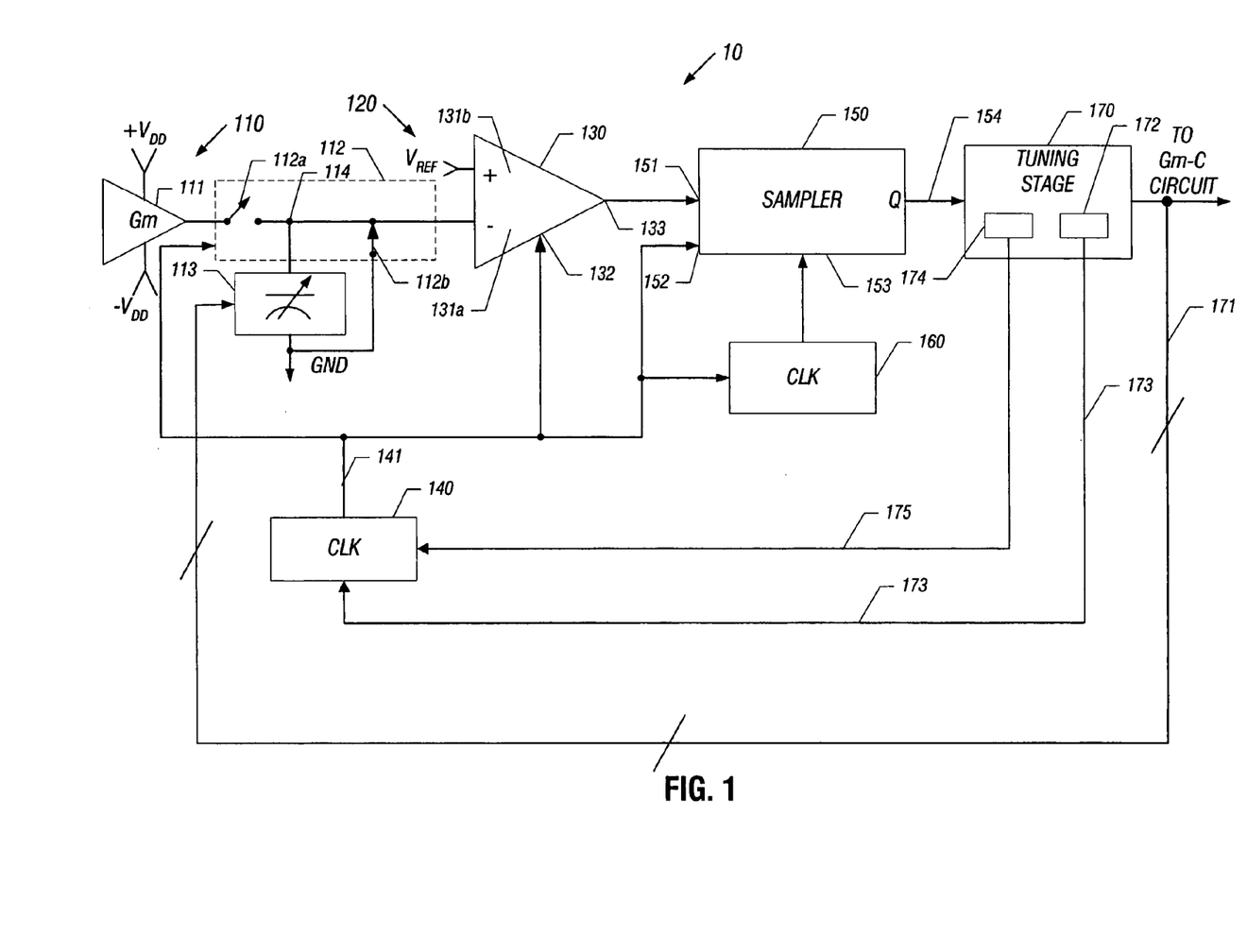
FIG. 1 is a high-level diagram of a circuit that may be used to achieve high-speed tuning of a Gm-C circuit.

Referring now to FIG. 1, depicted therein is a more or less canonical representation of a Gm-C tuning apparatus 10, in accordance with one embodiment of the invention. Gm-C tuning apparatus 10 is seen there to include a Gm-C (transconductance-capacitance) time-constant circuit 110 coupled to the inverting (−) input 131a of a comparator 130. Comparator 130 is responsive to the relative amplitudes of the time-varying signal at its (−) input and to a DC reference voltage ($V_{REF}$) applied to the noninverting (+) input 131b. Operation of Gm-C time-constant circuit 110 and operation of comparator 130 are synchronized by clock 140 (CLK 140). The output of comparator 130 is coupled to the sample control input 151 of a sampler 150. Operation of sampler 150 is likewise synchronized to Gm-C time-constant circuit 110 and to comparator 130 by CLK 140. Sampler 150 is driven by a precision clock 160 (CLK 160). In a manner that will be described in detail below, CLK 160 and time-constant circuit 110 are configured so that a predetermined relationship is established between the period (or, inversely, the frequency) of CLK 160 and the waveform generated by time-constant circuit 110. The output 154 of sampler 150 is coupled to a tuning control stage 170 in a manner that indicates to tuning control stage 170 the direction of correction, if any, that is required to be made to a tuning signal. As indicated in FIG. 1, in one embodiment of the invention, the tuning signal is applied to a tuning element in a Gm-C filter circuit (not shown), as well as to a matched tuning element in Gm-C time-constant circuit 110. For reasons that will be made clear immediately below, the tuning element in Gm-C time-constant circuit 110 and the tuning element in the Gm-C filter circuit may be viewed as conforming to a master/slave relationship.

More specifically, with continuing attention to FIG. 1, time-constant circuit 110 comprises a transconductance 111 coupled to complementary supply voltage ($+V_{DD}$, $-V_{DD}$). In a preferred embodiment, ($+V_{DD}$, $-V_{DD}$) may provide regulated DC voltages having predetermined values of opposite polarity. Transconductance 111 is coupled to a switch 112. In one embodiment, switch 112 may comprise a pair of semiconductor switching devices 112a and 112b, wherein, as depicted in FIG. 1, switching device 112a is configured in a normally open (NO) orientation, and switching device 112b is configured in a normally closed (NC) orientation. However, the specific characteristics of the constituent elements of switch 112 are not limitations on the scope of the invention.

Switch 112 operates in response to the output 141 of CLK 140, so that when CLK 140 provides an output signal at a first logic level (a logic ZERO, for example), switching device 112a is open, and switching device 112b is closed. In this situation, transconductance 111 is isolated from input 131a of comparator 130, and the voltage at inverting input 131a of comparator 130 is held at GND. Conversely, when the output of CLK 140 goes to a logic ONE, for example, switching device 112a will be driven closed, and switching device 112b will be driven open. Controllable capacitance 113 will be coupled to transconductance 111, and the voltage at input 131a of comparator 130 will become the voltage at a node 114 formed at the connection of transconductance 111 and controllable capacitance 113.

As indicated in FIG. 1, capacitance 113 presents a capacitive value that is controlled by a tuning signal 171 from tuning control stage 170. For present purposes, it may be assumed that the tuning signal is digital in nature and that the capacitive value of capacitance 113 increases as the (binary) value of the tuning signal increases. Consequently, when switching device 112a is closed (and assuming that the input impedance of comparator 130 is sufficiently high so as to be ignored), then transconductance 111 will source a constant current into node 114. This current will operate to charge capacitance 113. Consequently, Gm-C time-constant network 110 will provide a linearly increasing voltage waveform to input 131a of comparator 130. The rate at which the waveform increases varies, of course, inversely with the capacitive value of capacitance 113. As may be seen from FIG. 1, the voltage at the (+) input 131b of comparator 130 is determined by the reference voltage source 120. Specifically, reference voltage source 120 ($V_{REF}$) provides a constant reference voltage having a predetermined value.

Operation of the above-described portion of tuning apparatus 10 proceeds as follows. Immediately prior to each step of a tuning cycle, CLK 140 is assumed to be inactive (logic ZERO). (As will be made clear below, tuning apparatus 10 effects an iterative tuning process in which a limited number of tuning steps are performed, resulting ultimately in convergence of the value of the tuning signal to an "ideal" value, within a given precision.) At this time the voltage at input 131a is GND, the voltage at input 131b is $V_{REF}$, and the output of comparator 130 is a logic ONE. (Because $V_{REF}$>GND.) In one embodiment, represented in FIG. 1, CLK 140 may also be coupled to an enable input 132 of comparator 130, so that comparator 130 remains in a dormant state until CLK 140 transitions to logic ONE. In the dormant state, and immediately subsequent to the appearance of a synchronizing signal from CLK 140, the output of comparator 130 is, in one embodiment, a logic ONE. When the transition in CLK 140 occurs, switching device 112a is driven closed, and switching device 112b is driven open. Upon closure of switching device 112a and concurrent opening of switching device 112b, the voltage at input 131a will begin to increase linearly with a time constant that is determined by the respective values of transconductance 111 and capacitance 113.

In the embodiment of FIG. 1, capacitance 113 may be a controllable capacitance that presents a capacitive value determined by the tuning signal at the output of tuning correction stage 170. Capacitance 113 may, in one embodiment, be controllable within a range of, for example, 10 pf (picofarads) to 30 pf. However, the tuning range of capacitance 113 is not a specific aspect, or limitation, of the subject invention.

Skilled practitioners are aware that numerous approaches are available to realize a controllable capacitance such as capacitance 113. In one embodiment, capacitance 113 may be a varactor diode that exhibits a continuously controllable voltage/capacitance characteristic in response to either an analog or digital tuning voltage. Alternatively, capacitance 113 may be synthesized from the digitally controlled, parallel connection of a number of fixed capacitances. That is, capacitance 113 may comprise a number, say four (4), of binary-weighted capacitances that are selectively connected or disconnected in response to the value of a (4-bit, for example) digital tuning signal. For purposes of this Detailed Description, assume that the latter embodiment is applicable.

In addition, primarily for purposes of simplicity of exposition, capacitance 113 has been illustrated in FIG. 1 to consist of a single controllable capacitance. However, the invention is not limited in this regard. That is, in an alternative embodiment, capacitance 113 may comprise a controllable capacitance, of a form suggested above, coupled (in parallel, for example) with a fixed-value capacitance. This configuration would effectively limit the range within which the time-constant associated with time-constant network 111 might be susceptible to adjustment in response to the tuning signal. In certain implementations of the invention, the imposition of boundaries on the range of tuning may represent a desirable design objective. For purposes of construing the subject invention, however, it is necessary only that there be included some mechanism to control, via the tuning signal, the capacitive value presented by capacitive tuning element 113.

At a given point, as the voltage across capacitance 113 ramps in a positive direction from, for example, GND to $+V_{DD}$, the voltage at (−) input 131a will exceed the voltage at (+) input 131b. As a result, the output of comparator will undergo a high-to-low transition. The high-to-low transition in the output of comparator 130 may be used to control the operation of sampler 150 so as to effectively sample the periodic signal emanating from CLK 160.

Figures 2A, 2B, 2C:
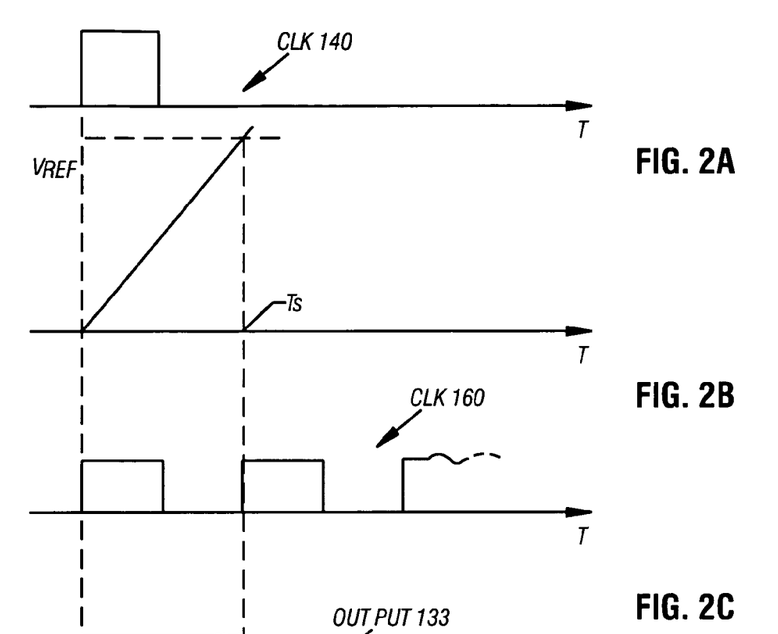
FIG. 2 is a timing diagram that illustrates significant waveforms encountered in a tuning process that is undertaken in accordance with one embodiment of the invention.

Gm-C time-constant circuit 110, comparator 130, sampler 150 and CLK 160 cooperate, in the manner described below, to provide a tuning error signal to tuning control stage 170. The tuning error signal is served from the manner in which CLK 160 is sampled in response to the waveform provided by Gm-C time-constant circuit 110. The essence of the aforementioned cooperation is to sample the precision clock signal provided to sampler 150 by CLK 160 in a manner that characterizes (e.g., as positive or negative) an error that may subsist in the tuning of capacitive tuning element 113. In this regard, then, comparator 130 and sampler 150 may be said to constitute a sampling mechanism by which the output of CLK 160 is sampled at an instant in time. In one embodiment of the invention, the sampling instant is determined by the waveform generated by Gm-C time-constant circuit 110, and, in particular, is determined by the time required for the voltage at node 114 (i.e., the voltage across capacitance 113) to reach $V_{REF}$. The manner in which such is achieved may be easily understood with reference to FIG. 2.

Referring now to FIG. 2, assume for pedagogical purposes that the inception of a tuning process, or, a step in a tuning process, is indicated by $T_0$ in FIG. 2. Each step of the tuning process provides information regarding the relative value, e.g., capacitance, to which capacitance 113 is tuned. Through implementation of an algorithm, an example of which is set forth below, tuning control stage 170 operates to correct deviations, if any, of the then-prevailing value of capacitance 113 from an "ideal" value, within a predetermined degree of precision. Accordingly, to the extent that such deviations are determined to exist, then it necessarily follows that a concomitant error exists in the tuning signal that is applied to capacitance 113.

FIGS. 2A–2E depict significant waveforms that arise at various stages in tuning apparatus 10 during the course of a tuning process. As may be seen from FIG. 2A, at $T_0$, a transition in CLK 140, from low to high, precipitates the tuning process. As CLK 140 goes to a logic ONE, NO switching device 112a closes, and NC switching device 112b opens, thereby respectively connecting capacitance 113 to transconductance 111 and coupling node 114 to (−) input 131a of comparator 130. In one embodiment, concurrent with the reorientation of switching devices 112a and 112b, CLK 140 may operate to enable comparator 130 and CLK 160, and to reset sampler 150. In this sense, then, CLK 160 may be viewed as synchronization clock, in that it provides a signal that synchronizes components invoked in the tuning process.

Immediately subsequent to initiation of the tuning process, capacitance 113 commences charging from GND toward $+V_{DD}$, with a time-constant determined by the value of transconductance 111 and the then-prevailing capacitive value of capacitance 113. See FIG. 2B. At times subsequent to $T_0$, the voltage at input 131a will depart from a predetermined ideal calculated value only by an amount that reflects the degree to which the time-constant of Gm-C network 110 departs from an "ideal" value.

Figure 2D:
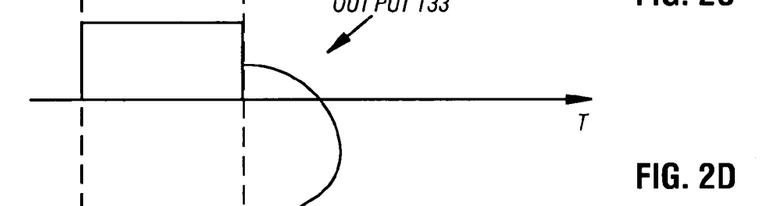
Figure 2E:
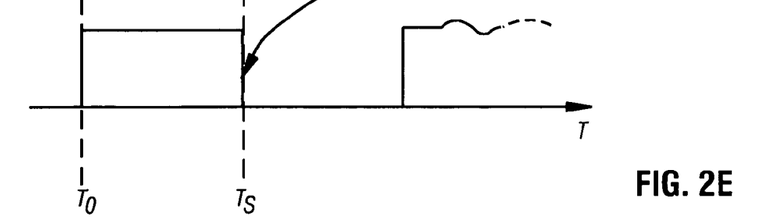

As illustrated by FIG. 2D, while capacitance 113 is in the early stages of charging, the output 133 of comparator 130 will remain at a logic ONE; that is, the voltage at (−) input 131a of comparator 130 will be less than the voltage at (+) input 131b, $V_{REF}$. As the charging continues, the voltage on capacitance 113 eventually exceeds $V_{REF}$. The instant at which capacitance 113 has charged to $V_{REF}$ is referred to here as $T_S$, the sampling instant. See FIG. 2B. At $T_S$, the output of comparator 130 will transition from a logic ONE to a logic ZERO. See FIG. 2D. The falling edge of comparator output 133 operates to sample the count then held by sampler 150 and, in one embodiment, to consequently disable continued counting of clock 160.

In accordance with the invention, the Gm-C time-constant effected by transconductance 111 and capacitance 113 is arranged to have predetermined relationship to the frequency of CLK 160. The aforesaid relationship may be readily understood with continued reference to FIG. 2. Specifically, given an ideally tuned capacitance 113, the voltage at (−) input 131a will be charged to the value $V_{REF}$ at exactly the instant that the Q output 154 of sampler 150 undergoes a high (logic ONE) to low (logic ZERO) transition. In this context, capacitance 113 may be said to be "ideally" tuned when it is caused, through application of a tuning signal from tuning control stage 170, to have the capacitance value that is required for the desired operation of the Gm-C filter, for example.

Understand, here, that capacitance 113 is replicated in the Gm-C filter by another capacitor, $C_x$. $C_x$ is "slaved" to capacitance 113 in at least the sense that the two capacitances are deemed to have substantially identical characteristics, and are subjected to tuning control by the same signal from tuning control stage 170. Once the desired (i.e., "ideal") value of $C_x$ is known, then that value may be mathematically assumed for capacitance 113 in constructing Gm-C time-constant circuit 110.

Skilled practitioners understand that, with resort to currently available semiconductor processing techniques, a very high degree of matching may be had between $C_x$ and capacitance 113. Accordingly, when the necessary digital tuning signal is applied to capacitance 113, $V_{REF}$ will be reached at precisely the instant illustrated in FIG. 2, and $C_x$ will assume the value of capacitance 113.

To reiterate, the negative-going transition in the output 133 of comparator 130, which occurs at the sampling instant, $T_S$, (i.e., when the voltage to which capacitance 113 becomes charged to a voltage greater than $V_{REF}$) causes the output of sampler 150 to be latched. As may be deduced from FIG. 2, under ideal circumstances, which obtain when the value of capacitance 113 is tuned to exactly the value of $C_x$, the sampling instant, $T_S$, will be precisely coincident with the falling edge of counter 150. However, if capacitance 113 is inaccurately tuned, then, depending on the direction of the tuning error, the sampling instant, $T_S$, will either anticipate or succeed the falling edge of sampler 150.

Specifically, in one embodiment of the invention, if the magnitude of the tuning signal applied to capacitance 113 is too great, then the value of capacitance 113 will be larger than the ideal value. Consequently, capacitance 113 will charge somewhat more slowly than desired, and the occurrence of the sampling instant will be delayed, i.e., will occur after the falling edge of sampler 150. Conversely, if the magnitude of the tuning signal applied to capacitance 113 is less than required, then the value of capacitance 113 will be less than the ideal value. In this situation, capacitance 113 will charge somewhat more rapidly than desired, and occurrence of the sampling instant will be premature, i.e., will occur prior to the falling edge of sampler 150.

Figure 3A:
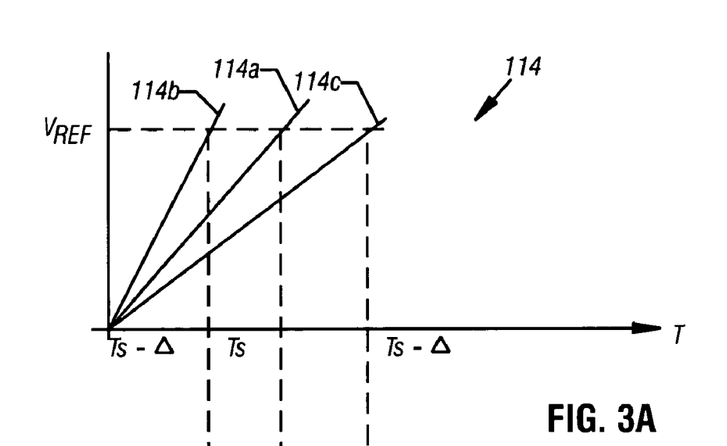
FIG. 3 illustrates the sampling waveforms generated in instances that correspond to accurate and inaccurate Gm-C tuning.
Figure 3B:
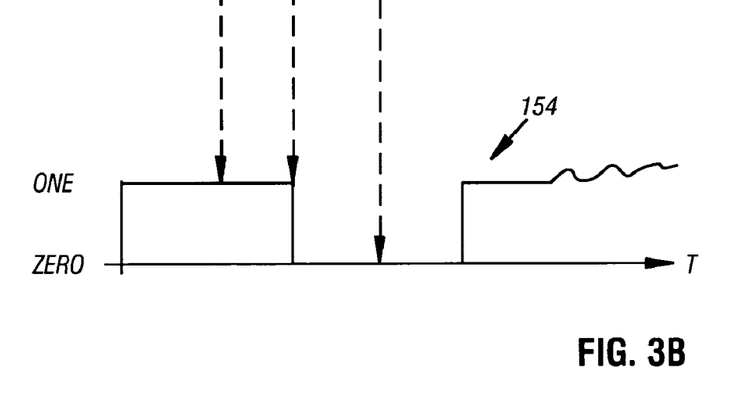

The temporal relationship that exists between the waveform generated by time-constant circuit 110 and the state of sampler 150 is graphically illustrated in FIG. 3. FIG. 3A depicts three exemplary waveforms that may be caused by time-constant network 110 to occur at node 114. Waveform 114a corresponds to a situation in which the tuning capacitance is perfectly tuned. As a result, the voltage at (−) input 131a of comparator 130 will traverse $V_{REF}$ at the nominal tuning instant, $T_S$. As may be seen with reference to FIG. 3B, $T_S$ occurs exactly coincidentally with a falling edge in the sampled output of sampler 150. Waveform 114b corresponds to a situation in which tuning capacitance 113 is adjusted to have a capacitive value that is too low. As a result, the voltage at (−) input 131a of comparator 130 will traverse $V_{REF}$ at time, $(T_S-\Delta)$, that anticipates $T_S$. At $(T_S-\Delta)$, the sampled output of sampler 150 is logic ONE. Waveform 114c corresponds to a situation in which tuning capacitance 113 is adjusted to have a capacitance value that is too high. As a result, the voltage at (−) input 131a of comparator 130 will traverse $V_{REF}$ at a time, $(T_S+\Delta)$, that succeeds $T_S$. At $(T_S+\Delta)$, the sampled output of sampler 150 is a logic ZERO. See FIG. 3B.

Accordingly, in the embodiment of the invention now described, if the tuned value of capacitance 113 is too high, then at the instant sampler 150 is sampled, the sampled output will be a logic ZERO. If the tuned value of capacitance 113 is too low when sampler 150 is sampled, the sampled output 154 will be a logic ONE. For convenience, the sampled output of sampler 150 may be perceived as a tuning error signal in that output 154 indicates the direction of correction that needs to be imparted to the then-prevailing tuning signal.

If the tuning error signal is a logic ZERO, then capacitance 113 must be adjusted (tuned) to a lower value. If the tuning error signal is a logic ONE, then master capacitance 113 must be adjusted to a higher value. Accordingly, in one embodiment of the invention, as suggested above, the tuning error signal is precisely binary. However, in alternative embodiments, the tuning error signal may assume values that depart from this convention. In a manner to be described immediately below, the tuning error signal may be applied to tuning control stage 170 so as to enable tuning control stage 170 to perform an iterative process that results in convergence of the value of the tuning signal to a desired value.

It is deemed worthwhile to note here that considerable design latitude inheres in the manner in which the waveform generated by Gm-C time-constant circuit 110 is caused to correlate to the period of CLK 160. With respect to the embodiment here described, time-constant circuit 110 is caused to correlate to the period of CLK 160. That is, time-constant circuit 110 and CLK 160 are arranged so that time-constant circuit 110 will achieve $V_{REF}$ at approximately the second occurrence (in a given tuning iteration) of a rising edge in CLK 160. Consequently, if sampler 150 is a ÷N counter and the Q output represents the LSB (least significant bit), then the second rising edge of CLK 160 is timewise equivalent to the first falling edge in the Q output of counter 160. From a different perspective, in this arrangement, the time required to charge capacitance 113 to $V_{REF}$ approximates one period (or cycle) of CLK 160. However, skilled practitioners will recognize that this relationship is merely exemplary and that time-constant circuit 110 is susceptible to alternative correlations to CLK 160. In general, the charging period of Gm-C time-constant circuit 110 may, by design, be caused to correlate to any integer number of periods of CLK 160.

In addition, skilled practitioners undoubtedly discern the design assumption that is implicit in the above-described embodiment. Specifically, in one embodiment, in order to foreclose the possibility of ambiguity in the sampler output, then the achievable tolerance in tuning capacitance 113 must be such that the charging period of Gm-C time-constant circuit 110, will, for all values of transconductance 111 and capacitance 113, be equal to $T_S \pm \Delta T_S$, where $T_S$ is the nominal period of CLK 160, and $\Delta$ is a fraction less than, for example, ½. Alternatively, if prevailing process tolerances are such that the above assumption is not justified, then additional logic may be indicated. In one implementation, the logic may operate to detect a particular transition in the output of CLK 160. If that transition occurs while the output of comparator 130 remains a logic ONE, then the tuning error signal (output 154 of sampler 150) will be clamped to a logic ZERO, for example. In particular, with regard to the implementation described herein above, if output 133 persists at a logic ONE upon the second rising edge in CLK 160, then output 150 will be forced to a logic ZERO.

Furthermore, in the embodiment of FIG. 1, sampler 150 may assume the form of a binary counter. However, the scope of the invention comprehends all implementations that enable sampler 150 to provide an output that is dependent on the value of a master tuning element, such as capacitance 113, in a manner that may be effectively used as an input to a tuning control stage.

(With respect to the above-described aspects of the invention, it is to be noted that such represents but one example of an embodiment of the invention, and has been propounded here primarily to convey, with precision and concision, an understanding of the invention. Skilled practitioners comprehend that many of the specific features of the described embodiment do not impose constraints on the scope of the invention, but, rather, constitute design details that may aptly be relegated to the judicious discretion of the practitioner. For example, the operative polarities of the sampling output of comparator 130, the output of counter 150 (qua tuning error signal), and sensitivity of the value of capacitance 113 to tuning signal are, within reason, arbitrary. To wit: in alternative embodiments, the sampling signal may be a rising, rather than falling, edge at the output of comparator 150; a tuning error signal at logic ZERO may correspond to a value of capacitance 113 that is low, and a logic ONE to a value that is too high; and an increase in the value of the tuning signal may be necessary to effect a reduction in the value of the master tuning capacitance.)

Re-directing attention now to FIG. 1, as indicated there, the tuning error signal at the output of counter 150 is coupled to tuning correction stage 170. The tuning error signal informs tuning correction stage 170 whether, when last sampled, the value of master tuning capacitance 113 was too large or too small. If the value of capacitance 113 is too large, a negative correction in the tuning signal is required. If the value of capacitance 113 is too small, then a positive correction is required. (recall that the convention applied to the polarity of the tuning error signal is meant to be exemplary, and is not a limitation on the scope of the invention.)

In response to the tuning error signal, tuning control stage 170 performs a tuning process step that imparts an incremental correction in the tuning signal. The polarity (i.e., positive or negative) of the correction is determined by the tuning error signal at the output of sampler 150. The magnitude of the incremental correction, for any process step, may be effected according to any one of a number of algorithms that are calculated to cause convergence in the tuning signal from an initial value to an ultimate value that conforms to an ideal value, within a predetermined degree of precision.

In one embodiment of the invention, tuning control stage 170 operates to provide a digital tuning signal to both master controllable capacitance 113 and to the corresponding slave controllable capacitance, $C_x$, in a downstream Gm-C filter. Tuning control stage 170 is designed, in accordance with one embodiment, to provide a 4-bit digital tuning signal, which may be represented as (B4, B3, B2, B1), wherein bits B4, B3, B2, B1 are arranged in a descending order of significance, i.e., MSB (most significant bit) to LSB (least significant bit).

Figure 4:
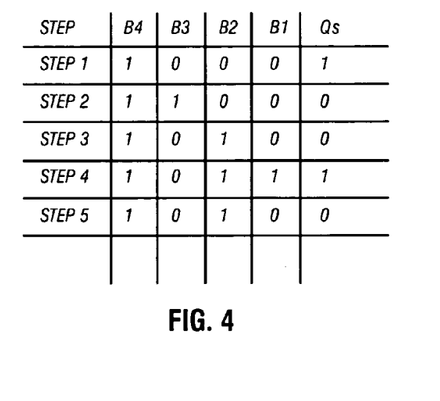
FIG. 4 represents hypothetical values of a digital tuning signal, as the digital tuning signal converges, in response to a tuning error signal and according to a defined algorithm, to an ideal value.

Hypothetical tuning values are illustrated in FIG. 4. At the inception of a tuning process, (i.e., at Step 1) which may require, in the manner presently to be described, a number of iterative tuning cycles or steps, tuning control stage 170 provides a tuning signal equal to (1, 0, 0, 0). This magnitude of tuning signal corresponds to, approximately, the midpoint of the range of tuning signal values that may be applied to capacitance 113. FIG. 4, depicts an example of the steps that may be encountered in arriving at an acceptable value for the tuning signal.

With reference to FIG. 4, assume that at the end of Step 1, the first sampling instant, $T_S$, the output of sampler 150 is a logic ONE, indicating that a positive correction is to be made (by the tuning control stage) in the value of the tuning signal. In order to increase the value of capacitance 113 in response to the tuning error signal, tuning control stage 170 increments tuning signal to (1, 1, 0, 0), at step 2.

If after Step 2 (the next iterative sampling step), sampler 150 becomes a logic ZERO, then a decrease in the value of the tuning signal (and a decrease in the value of capacitance 113) is indicated. This is true because the time-constant effected by capacitance 113 was too great. In one embodiment, tuning control stage 170 implements an algorithm whereby the magnitude of each successive correction is one-half (rounded to the nearest integer) of the magnitude of the immediately preceding correction. The direction, or sign, of the correction is an indicated by counter 170.

Accordingly, because at Step 2 a (+) correction of (0, 1, 0, 0) was made, here (Step 3) a (−) correction of (0, 0, 1, 0) will be made, resulting in a tuning signal having a value of (1, 0, 1, 0). If at the end of this Step 3, the sampled error signal persists at a logic ZERO, then, at Step 4, a (+) correction of (0, 0, 0, 1) will be made, resulting in the tuning signal (1, 0, 1, 1). If at the end of Step 4, the sample counter value toggles to a logic ONE, then (−) correction of (0, 0, 0, 1) will be made, resulting in a tuning signal (1, 0, 1, 0). This, of course, results in a sampled error signal that again toggles to a logic ZERO. It is known that this result must occur, because at Step 3 the identical tuning signal (1, 0, 1, 0) was applied and resulted in a tuning error signal at logic ZERO.

At this point, (the end of Step 5) it is apparent, or may be easily demonstrated, that convergence in the value of the tuning signal has been realized. Convergence may be detected in the form of toggling (changing value upon consecutive successive steps) of the least significant bit, B1, in the tuning signal. With respect to the above hypothetical tuning process, recall that B1 assumed successive values of (0, 1, 0) at the respective Steps 3, 4, and 5.

Accordingly, in one embodiment of the invention, the tuning stage 170 comprises a convergence detector 172. Convergence detector 172 operates in a straightforward manner to detect toggling in B1 of the tuning signal and to generate an output 173 in response thereto. Output 173 may, in one embodiment, be coupled to CLK 140. In response to the tuning convergence signal 173, CLK 140 will reset tuning apparatus 10. As may be also seen in FIG. 4, tuning stage 170 also comprises a step-completion detector 174 that provides a step-completion signal 175. In response to step-completion signal 175, CLK 140 generates a pulse that resets time-constant network 110, comparator 130 and sampler 150, in anticipation of the next Step in an undergoing tuning process.

Upon convergence, maximum available precision given the number of bits in the tuning signal has been captured in the tuning signal.

The algorithm implemented in the above embodiment may be simply articulated:

At Step 1, tuning signal=(1, 0, 0, 0).
At Step 2, If Q=1, tuning signal=(1, 1, 0, 0);
If Q=0, tuning signal=(0, 1, 0, 0).

At every Step thereafter, the direction (positive, negative) in the tuning signal is determined by the value of the tuning error signal (output 154 of sampler 150) at the end of the immediately preceding Step. The magnitude of correction is equal to one-half the absolute magnitude of the immediately preceding correction, rounded up to the nearest integer, if necessary. Convergence of the above iterative may be detected by the toggling of B1.

A disclaimer is here warranted. Tuning control stage 170 may be implemented in numerous techniques, all within the ken of skilled practitioners. For example, the available techniques include implementation in the form of combinational or sequential logic, state machines, and ROM (read only memory), to name but a few. Furthermore, the scope of the invention admits of implementation, in whole or in part, by virtue of software programming.

To that end, skilled practitioners recognize that embodiments may be realized in software (or in the combination of software and hardware) that may be executed on a host system, such as, for example, a computer system, a wireless device, or the like. Accordingly, such embodiments may comprise an article in the form of a machine-readable storage medium onto which there are written instructions, data, etc. that constitute a software program that defines at least an aspect of the operation of the system. The storage medium may include, but is not limited to, any type of disk, including floppy disks, optical disks, compact disk read-only memories (CD-ROMs), compact disk rewritables (CD-RWs), and magneto-optical disks, and may include semiconductor devices such as read-only memories (ROMs), random access memories (RAMs), erasable programmable read-only memories (EPROMs), electrically erasable programmable read-only memories (EEPROMs), flash memories, magnetic or optical cards, or any type of media suitable for storing electronic instructions. Similarly, embodiments may be implemented as software modules executed by a programmable control device, such as a computer processor or a custom designed state machine.

Figure 5:
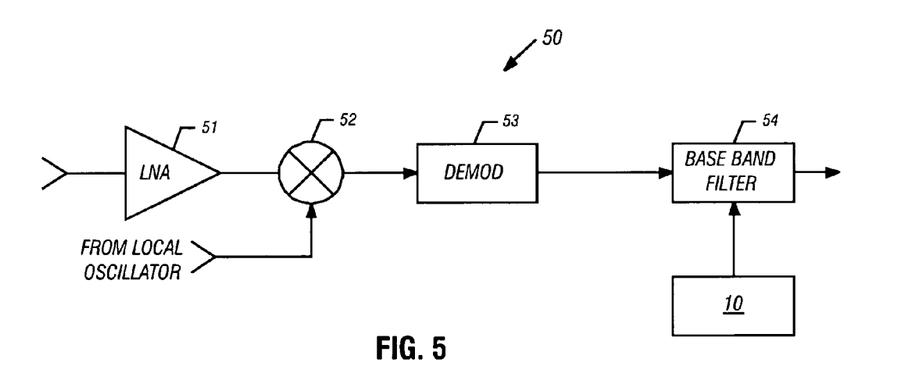
FIG. 5 is a system block diagram of a receiver system that incorporates a Gm-C tuning apparatus in accordance with an embodiment of the invention.

The subject Gm-C tuning technique is attractive in numerous applications. For example, the apparatus may be used with salutary effect in a receiving system such as depicted in FIG. 5. The receiving system of FIG. 5 is representative in its salient aspects of receiving systems that may be used in connection with DBS (direct broadcast satellite) communications equipment and may be included in the familiar set-top box for satellite television systems.

As illustrated in FIG. 5, receiving system 50 comprises a low-noise amplifier (LNA) 51 that serves as front end of the receiver. LNA 51 is, in operation, coupled to an appropriate antenna (not shown). The output of LNA 51 is frequency converted in a mixer 52. The frequency-converted output of mixer 52 is demodulated by demodulator 53. In many receiver system architectures, an IF (intermediate frequency) amplifier is interposed between mixer 52 and demodulator 53. The demodulated signal is coupled to a baseband filter 54, i.e., a low-pass filter with specified a cutoff frequency.

Many contemporary DBS receiving systems are known to incorporate a tunable baseband filter that is predicated on Gm-C tuning. Accordingly, baseband filter 54 is coupled to, and is tuned by, a Gm-C tuning apparatus such as is depicted in FIG. 1 and described in detail hereinabove.

From the above Detailed Description, it is clear that the subject invention represents a valuable approach to achieve high-speed tuning of Gm-C filter circuits, as well as other system components, that incorporate tunable Gm-C circuits. A principal advantage of the subject Gm-C tuning technique derives from the implementation of a tuning process as a number of iterative steps, wherein a tuning error signal is generated at the end of each of the steps. Each of the steps is predicated on comparison of a time-varying waveform to one cycle (or, in alternative embodiments, an integer number of cycles) of a precision clock. Because the achievable precision in the tuning signal is largely divorced from the number of precision clock cycles, the frequency of the clock need not be excessively high. Therefore, the technique is comfortably amendable to conventional integrated circuit fabrication techniques, and resort to large-value capacitances, or unwieldy transconductances, need not be had.

Be aware, however, that although the invention has been described with specific reference to an embodiment in which tuning is effected by virtue of a controllable voltage that is applied to a capacitance, the invention is extensible with facility to other regimes in which Gm-C tuning is required, encountered or suggested. For example, the invention is equally applicable to tuning of a transconductance element, and the tuning signal maybe applied in the form of a current, as well as in the form of a voltage.

In this regard, skilled practitioners will comprehend that the gravamen of the invention is the use of a master Gm-C circuit, e.g., Gm-C circuit 110, that is matched to a slave Gm-C circuit that inhabits a baseband filter, a PLL, etc. That is, with respect to Gm-C circuit 110, transconductance 111 and capacitance 113 are matched to a respective transconductance and capacitance in the slave Gm-C circuit that is to be tuned in the baseband filter, for example. Accordingly, an objective of tuning apparatus 10 is to cause equivalence between the Gm-C time-constant of master circuit 110 and the corresponding Gm-C time constant of the slave Gm-C circuit. The "ideal" value of the Gm-C time-constant (in both the master and slave circuit) is related to a precision signal in a predetermined manner, an embodiment of which has been described above.

Furthermore, although as described herein the tuning signal is digital in nature, skilled practioners understand that an analog tuning signal may be made available through the simple expedient of a D/A (digital-to-analog) converter.

Accordingly, while the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus to tune a tunable Gm-C circuit, the apparatus comprising:
    a master Gm-C circuit comprising a transconductance and a tunable element, wherein the master Gm-C circuit is configured to provide a waveform that is dependent on a tuning signal applied to the tunable element;
    a first signal generator to generate a first clock signal;
    a second signal generator to provide a second clock signal to the master Gm-C circuit;
    a sampler having a first input coupled to receive the waveform from the master Gm-C circuit, a second input coupled to receive the first clock signal, a third input coupled to receive the second clock signal, and an output to provide a tuning error signal; and
    a tuning control stage having an input coupled to the output of the sampler and having an output to provide the tuning signal to the master Gm-C circuit and to the tunable Gm-C circuit.

2. An apparatus as defined in claim 1, wherein the tuning error signal is dependent upon a relationship between the first clock signal and the waveform provided by the master Gm-C circuit.

3. An apparatus as defined in claim 2, wherein the tuning error signal assumes a first value in response to a value of the waveform in a first direction and assumes a second value in response to a value of the waveform in a second direction.

4. An apparatus as defined in claim 1, further comprising a comparator coupled between the master Gm-C circuit and the sampler.

5. An apparatus as defined in claim 1, wherein the tuning control stage is operative in response to the tuning error signal to adjust the tuning signal in a first direction in response to a first value of the tuning error signal and to adjust the tuning signal in a second direction in response to a second value of the tuning error signal.

6. An apparatus as defined in claim 5, wherein the tuning control stage is configured to provide, during tuning, a sequence of digital tuning signals, wherein the sequence of digital tuning signals converges to a final digital tuning signal that approximates an ideal digital tuning signal.

7. An apparatus as defined in claim 6, wherein the tuning control stage is configured to provide a predetermined initial digital tuning signal at inception of the tuning and to provide subsequent sequential digital tuning signals in response to operation of the master Gm-C circuit.

8. The apparatus of claim 1, wherein the tuning control stage comprises a convergence detector and a completion detector.

9. The apparatus of claim 8, wherein the convergence detector is to detect toggling in the tuning signal and to generate a convergence output in response to the toggling.

10. The apparatus of claim 8, wherein the completion detector is to detect completion of a tuning step by the tuning control stage and to generate a completion output in response to the completion.

11. The apparatus of claim 1, wherein the second signal generator is to reset the apparatus upon receipt of the convergence output.

12. The apparatus of claim 1, wherein the second signal generator is to reset the master Gm-C circuit upon receipt of the completion output.

13. The apparatus of claim 1, further comprising a switch to selectively couple the transconductance to the tunable element.

14. A tuning apparatus comprising:
a waveform generator to provide a time-varying waveform, the waveform generator comprising a master controllable tuning element;
a first clock generator to control the waveform generator;
a second clock generator to provide a precision clock signal;
means responsive to the precision clock signal for sampling the time-varying waveform; and
a tuning control stage coupled to the means for sampling to generate a corrected tuning signal in response to an output of the means for sampling, the corrected tuning signal to be provided to the master controllable tuning element and to a slave controllable tuning element, wherein the tuning control stage is to generate a reset signal to reset the waveform generator.

15. A tuning apparatus as defined in claim 14, wherein the master controllable tuning element is matched to the slave controllable tuning element.

16. A tuning apparatus as defined in claim 14, wherein the sampling means comprises:
a first circuit to provide a binary output signal that has a value determined by the time-varying waveform; and
a second circuit coupled to the first circuit and to the second clock generator, the second circuit to provide a tuning error signal.

17. A tuning apparatus as defined in claim 16, wherein the tuning error signal assumes a first value in response to a tuning error in a first direction and assumes a second value in response to a tuning error in a second direction.

18. A tuning apparatus as defined in claim 16, wherein the first circuit comprises a comparator and the second circuit comprises a sampler.

19. A tuning apparatus as defined in claim 18, wherein the comparator comprises a first input coupled to a reference voltage and a second input coupled to the waveform generator, wherein the comparator is to provide a comparator output signal determined by the relationship between the reference voltage and the time-varying waveform.

20. A tuning apparatus as defined in claim 14, wherein the tuning control stage is configured to provide, during tuning, a sequence of digital tuning signals, wherein the sequence of digital tuning signals converges to a final digital tuning signal that approximates an ideal digital tuning signal.

21. A tuning apparatus as defined in claim 20, wherein the tuning control stage is configured to provide a predetermined initial digital tuning signal at inception of the tuning and to provide subsequent sequential digital tuning signals in response to operation of the waveform generator.

22. A system comprising:
a low-noise amplifier (LNA) to receive a modulated carrier;
a mixer coupled to the LNA;
a demodulator coupled to the mixer;
a Gm-C filter coupled to the demodulator; and
an apparatus to tune the Gm-C filter, the apparatus comprising:
a waveform generator to provide a time-varying waveform, the waveform generator comprising a transconductance and a master controllable tuning element;
a first clock generator to provide a first clock signal;
a sampling circuit coupled to receive the first clock signal and a second clock signal, the sampling circuit responsive to the first clock signal to sample the time-varying waveform:
a second clock generator to provide the second clock signal to drive the waveform generator; and
a tuning control stage coupled to the sampling circuit to generate a tuning signal in response to an output of the sampling circuit, the tuning signal to be provided to the master controllable tuning element and to a slave controllable tuning element in the Gm-C filter.

23. A tuning apparatus as defined in claim 22, wherein the master controllable tuning element is matched to the slave controllable tuning element.

24. A tuning apparatus as defined in claim 22, wherein the sampling circuit comprises:
a first circuit to provide a binary output signal that has a value determined by the relationship of the time-varying waveform to a reference voltage; and
a second circuit coupled to the first circuit and to the first clock generator, the second circuit to provide a tuning error signal.

25. A tuning apparatus as defined in claim 24, wherein the tuning control stage is operative in response to the tuning error signal to control the tuning signal in a first direction in response to a first value of the tuning error signal and control the tuning signal in a second direction in response to a second value of the tuning error signal.

26. A tuning apparatus as defined in claim 25, wherein the tuning control stage is configured to provide, during the course of a tuning process, a sequence of digital tuning signals, wherein the sequence of digital tuning signals converges to a final digital tuning signal that approximates an ideal digital tuning signal.

27. A tuning apparatus as defined in claim 26, wherein the tuning stage is configured to provide a predetermined initial digital tuning signal at inception of the tuning process and to provide subsequent sequential digital tuning signals in response to operation of the waveform generator.

28. A method comprising:
   measuring a time period of a time-constant circuit including a master controllable tuning element under control of a first clock signal, wherein the time-constant circuit is coupled to a sampler that synchronizes the measure of the time period responsive to a second clock signal;
   generating a tuning signal based on the measured time period and feeding the tuning signal back to the time-constant circuit until the measured time period reaches a desired value; and
   providing the tuning signal to a slave controllable transconductance.

29. A method as defined in claim 28, further comprising controlling the master controllable tuning element with the tuning signal.

30. A method as defined in claim 28, further comprising providing a predetermined initial digital tuning signal at inception of a tuning process and providing sequential digital tuning signals in response to the time period.

31. A method as defined in claim 30, further comprising: providing the sequential digital tuning signals until convergence at a final digital tuning signal that is provided to the slave controllable transconductance.

32. A method as defined in claim 31, further comprising: driving a counter with a clock signal that has a clock period related to an ideal tuning voltage for the master controllable tuning element.

33. An apparatus comprising:
   a master circuit including a tunable element, wherein the master circuit is to generate a waveform based upon on a tuning signal;
   a first signal generator to control operation of the master circuit;
   a tuning controller coupled to receive the waveform and having an output to provide the tuning signal to the master circuit and to a Gm-C filter, wherein the tuning controller comprises a convergence detector and a completion detector, wherein the first signal generator is to reset the apparatus upon receipt of a convergence output from the convergence detector and to reset the master circuit upon receipt of a completion output from the completion detector.

34. The apparatus of claim 33, wherein the convergence detector is to detect toggling in the tuning signal and to generate the convergence output in response to the toggling.

35. The apparatus of claim 33, wherein the completion detector is to detect completion of a tuning step by the tuning controller and to generate the completion output in response to the completion.

36. The apparatus of claim 33, wherein the master circuit further comprises a switch to selectively couple a transconductance to the tunable element.

37. The apparatus of claim 33, wherein the convergence detector and the completion detector are coupled to the first signal generator.

* * * * *

UNITED STATES PATENT AND TRADEMARK OFFICE
CERTIFICATE OF CORRECTION

PATENT NO. : 7,019,586 B2  Page 1 of 1
APPLICATION NO. : 10/806630
DATED : March 28, 2006
INVENTOR(S) : Zhiwei Dong It is certified that error appears in the above-identified patent and that said Letters Patent is hereby corrected as shown below:

Claim 11:
Line 1, "1" should be --9--.

Claim 12:
Line 1, "1" should be --10--.

Claim 23:
Line 1, "tuning apparatus" should be --system--.

Claim 24:
Line 1, "tuning apparatus" should be --system--.

Claim 25:
Line 1, "tuning apparatus" should be --system--.

Claim 26:
Line 1, "tuning apparatus" should be --system--.

Claim 27:
Line 1, "tuning apparatus" should be --system--.

Signed and Sealed this

Fourteenth Day of November, 2006

JON W. DUDAS
*Director of the United States Patent and Trademark Office*